(12) United States Patent
Hao

(10) Patent No.: US 10,365,526 B2
(45) Date of Patent: Jul. 30, 2019

(54) ARRAY SUBSTRATE, MANUFACTURING METHOD THEREOF, AND DISPLAY DEVICE

(71) Applicant: Shenzhen China Star Optoelectronics Semiconductor Display Technology Co., Ltd., Shenzhen, Guangdong (CN)

(72) Inventor: Sikun Hao, Guangdong (CN)

(73) Assignee: Shenzhen China Star Optoelectronics Semiconductor Display Technology Co., Ltd, Shenzhen, Guangdong (CN)

(*) Notice: Subject to any disclaimer, the term of this patent is extended or adjusted under 35 U.S.C. 154(b) by 0 days.

(21) Appl. No.: 15/577,223

(22) PCT Filed: Sep. 21, 2017

(86) PCT No.: PCT/CN2017/102538
§ 371 (c)(1),
(2) Date: Nov. 27, 2017

(87) PCT Pub. No.: WO2019/015077
PCT Pub. Date: Jan. 24, 2019

(65) Prior Publication Data
US 2019/0025658 A1   Jan. 24, 2019

(30) Foreign Application Priority Data
Jul. 20, 2017 (CN) .......................... 2017 1 0595856

(51) Int. Cl.
*H01L 27/12* (2006.01)
*G02F 1/1335* (2006.01)
(Continued)

(52) U.S. Cl.
CPC ...... *G02F 1/136286* (2013.01); *G02F 1/1368* (2013.01); *G02F 1/133516* (2013.01);
(Continued)

(58) Field of Classification Search
CPC ....................................................... H01L 27/124
See application file for complete search history.

(56) References Cited

U.S. PATENT DOCUMENTS 5,952,675 A * 9/1999 Katoh ............... G02F 1/136213
257/59
7,545,449 B2   6/2009 Nakamura et al.
(Continued)

FOREIGN PATENT DOCUMENTS

CN    100381930 C    4/2008
CN    100499085 C    6/2009

*Primary Examiner* — William A Harriston
(74) *Attorney, Agent, or Firm* — Andrew C. Cheng (57) ABSTRACT

An array substrate, manufacturing method thereof and display device are provided. The array substrate includes a plurality of scan lines, a plurality of data lines intersecting with the plurality of scan lines to as to define a plurality of pixel areas; a plurality of auxiliary segments, and each scan line and/or each data line respectively corresponding to at least a auxiliary segment, the scan line and/or data line and the corresponding auxiliary segment forming capacitive coupling to reduce signal delay on the scan line and/or data line. As such, the signal delay on the scan line and/or data line is reduced, and the charging rate and display effect are improved.

10 Claims, 8 Drawing Sheets

(51) Int. Cl.
*G02F 1/1362* (2006.01)
*G02F 1/1368* (2006.01)

(52) U.S. Cl.
CPC ...... *G02F 1/136227* (2013.01); *H01L 27/124* (2013.01); *H01L 27/1262* (2013.01); *G02F 2001/136222* (2013.01); *G02F 2001/136295* (2013.01); *G02F 2201/122* (2013.01)

(56) References Cited

U.S. PATENT DOCUMENTS

| | | |
|---|---|---|
| 2008/0084529 A1 | 4/2008 | Wang et al. |
| 2008/0158464 A1 | 7/2008 | Chang |

* cited by examiner

ARRAY SUBSTRATE, MANUFACTURING METHOD THEREOF, AND DISPLAY DEVICE

BACKGROUND OF THE INVENTION

1. Field of the Invention

The present invention relates to the field of display techniques, and in particular to an array substrate, manufacturing method thereof, and display device.

2. The Related Arts

The liquid crystal display (LCD), due to the advantages of light-weight, small-size and low power-consumption, has become the most widely used panel display device, and applied to cell phones, digital cameras, PC, and other electronic devices.

As the resolution of LCD device increases and the pixel charging time decreases, the pixel charging rate decreases because the loading of the pixel is unchanged. In the mean time, because the scan lines and data lines of the LCD device overlap much, parasitic capacitance is generated during charging, which becomes the main factor in signal delay when combined with the resistance of the scan line and the date lines. As such, the pixel charging rate is affected, and the display effect of the LCD is reduced.

SUMMARY OF THE INVENTION

The present invention provides an array substrate, manufacturing method thereof, and display device, able to solve the technical problems of signal delay and low charging rate in the conventional LCD device.

To overcome the shortcomings of the known technique, the present invention provides an array substrate, comprising:

a plurality of scan lines;

a plurality of data lines, intersecting with the plurality of scan lines so as to define a plurality of pixel areas;

a plurality of auxiliary segments, wherein each of the plurality of scan lines and/or each of the plurality of data lines corresponding respectively to at least an auxiliary segment, the scan lines and/or data lines forming capacitive coupling with corresponding auxiliary segments to reduce signal delay on the scan lines and/or data lines.

To overcome the shortcomings of the known technique, the present invention also provides a manufacturing method of array substrate, comprising:

forming a plurality of scan lines, a plurality of first auxiliary segments and gates of a plurality of thin film transistors (TFT), wherein the gate of each TFT being connected to a corresponding scan line;

forming a semiconductor layer of the plurality of TFTs;

forming a plurality of data lines, a plurality of second auxiliary segments, and sources and drains of a plurality of TFTs, wherein the source of each TFT being connected to a corresponding data line;

forming a plurality of pixel electrodes, wherein each pixel electrodes being connected to the drain of a corresponding TFT;

wherein each scan line and/or each data line respectively corresponding to at least a auxiliary segment, the scan line and/or data line and the corresponding auxiliary segment forming capacitive coupling to reduce signal delay on the scan line and/or data line.

To overcome the shortcomings of the known technique, the present invention also provides a display device, comprising an above array substrate.

By disposing at least an auxiliary segment corresponding to each scan line and/or each data line on the array substrate, the present invention can reduce the signal delay on the scan line and/or data line, improve charging rate and display effect.

BRIEF DESCRIPTION OF THE DRAWINGS

To make the technical solution of the embodiments according to the present invention, a brief description of the drawings that are necessary for the illustration of the embodiments will be given as follows. Apparently, the drawings described below show only example embodiments of the present invention and for those having ordinary skills in the art, other drawings may be easily obtained from these drawings without paying any creative effort. In the drawings.

DETAILED DESCRIPTION OF THE PREFERRED EMBODIMENTS

To further explain the technical means and effect of the present invention, the following refers to embodiments and drawings for detailed description. Apparently, the described embodiments are merely some embodiments of the present invention, instead of all embodiments. All other embodiments based on embodiments in the present invention and obtained by those skilled in the art without departing from the creative work of the present invention are within the scope of the present invention.

Figure 1:
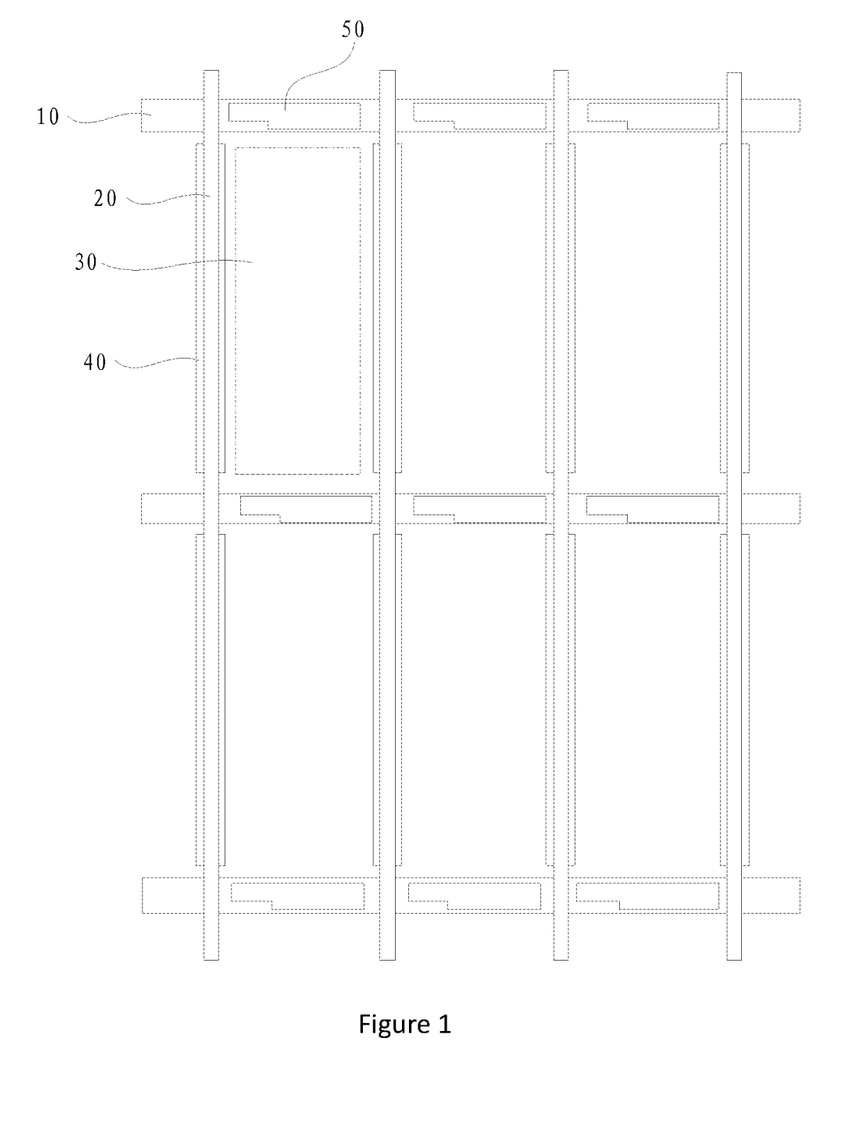
FIG. 1 is a schematic view showing the structure of an array substrate provided by an embodiment of the present invention.
Figure 2:
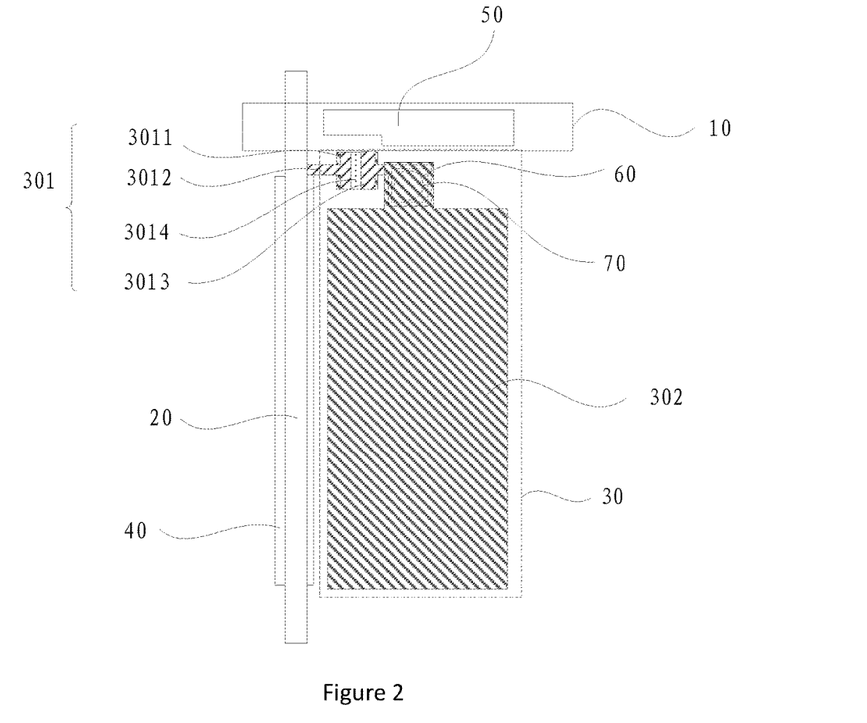
FIG. 2 is a schematic view showing the structure of a pixel of an array substrate provided by an embodiment of the present invention.

Refer to FIG. 1 and FIG. 2. An array substrate of the present invention comprises:

a plurality of scan lines 10;

a plurality of data lines 20, intersecting with the plurality of scan lines 10 so as to define a plurality of pixel areas 30;

a plurality of auxiliary segments, wherein each of the plurality of scan lines 10 and/or each of the plurality of data lines 20 corresponding respectively to at least an auxiliary segment, the scan lines 10 and/or data lines 20 forming capacitive coupling with corresponding auxiliary segments to reduce signal delay on the scan lines 10 and/or data lines 20.

Optionally, the auxiliary segment comprises a first auxiliary segment 40 and a second auxiliary segment 50, wherein the first auxiliary segment 40 is parallel to the data line 20, and is disposed at the same layer as the scan line 10. A part of each data line 20 corresponding to inside of a pixel area 30 corresponds to a first auxiliary segment 40, and the length of the first auxiliary segment 40 is less than the part of each data line 20 corresponding to inside of a pixel area 30 so that the first auxiliary segment 40 does not overlap the overlapping part of the scan line 10 and data line 20. The second auxiliary segment 50 is parallel to the scan line 10, and is disposed at the same layer as the data line 20. A part of each scan line 10 corresponding to inside of a pixel area 30 corresponds to a second auxiliary segment 50, and the length of the second auxiliary segment 50 is less than the part of each scan line 10 corresponding to inside of a pixel area 30 so that the second auxiliary segment 50 does not overlap the overlapping part of the scan line 10 and data line 20.

Optionally, the auxiliary is in a floating state so as to form capacitive coupling with the scan line 10 or the data line 20.

Optionally, each pixel area 30 comprises a TFT 301 and a pixel electrode 302, wherein the TFT 301 has a gate 3011 electrically connected to a corresponding scan line 10, a source 3012 electrically connected to a corresponding data line 20, and a drain 3013 electrically connected to the pixel electrode 302.

Wherein, the gate 3011 of the TFT 301 is disposed at the same layer as the first auxiliary segment 40, and the source 3012 and the drain 3013 of the TFT 301 are disposed at the same layer as the second auxiliary segment 50.

Refer to FIG. 1-FIG. 4. In other embodiments, the array substrate can be disposed with only the first auxiliary segments 40, parallel to the data line 20 and disposed at the same layer as the scan lines 10.

Figure 3:
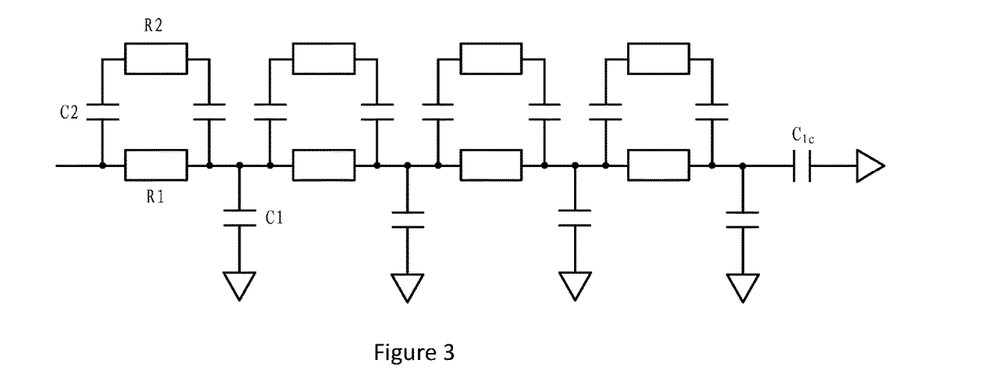
FIG. 3 is a schematic view showing the equivalent circuit of the array substrate provided by an embodiment of the present invention.
Figure 4:
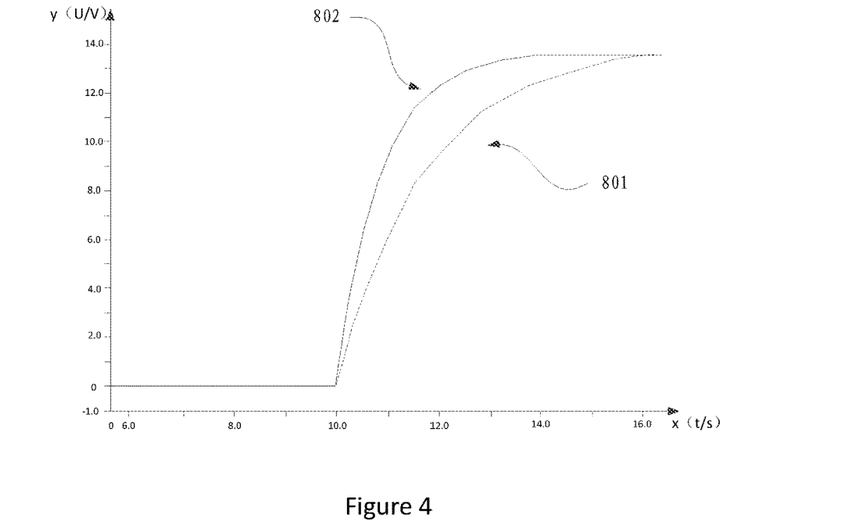
FIG. 4 is a schematic view showing the pixel charging waveform of the array substrate provided by an embodiment of the present invention.

Wherein, the data line 20 inside each pixel area 30 has an equivalent resistance R1, the parasitic capacitance C1 is generated by the scan line 10 and the data line 20 overlapping, each first auxiliary segment 40 has an equivalent resistance R2, and the first auxiliary segment 40 is in a floating state so as to form capacitive coupling C2 with the data line 20. The data line 20 is grounded through the liquid crystal capacitor Clc, and the Clc has one end connected to the pixel electrode. FIG. 4 sows the relation between the voltage between the two ends of Clc and time, i.e., the waveform of pixel charging, comprising: a curve 801 indicating the voltage between the two ends of Clc versus time in prior art, and a curve 802 indicating the voltage between the two ends of Clc versus time of the present invention. As shown, the voltage between the two ends of Clc in the present invention rises faster as time passes, which shows the pixel charging rate in the present invention is higher than in the prior art.

Optionally, in other embodiments, the array substrate can be disposed with only the second auxiliary segments 50, parallel to the scan line 10 and disposed at the same layer as the data lines 20, wherein the second auxiliary segment 50 is in a floating state so as to form capacitive coupling C2 with the scan line 10.

By disposing at least an auxiliary segment corresponding to each scan line and/or each data line on the array substrate, the present invention can reduce the signal delay on the scan line and/or data line, improve charging rate and display effect.

Figure 5:
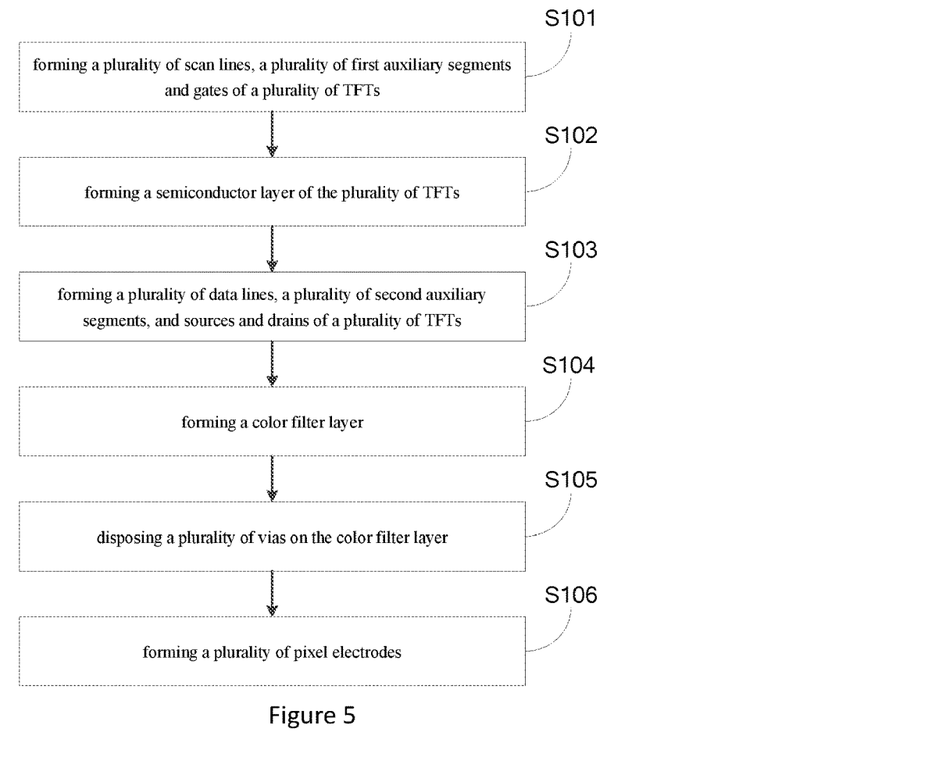
FIG. 5 is a schematic view showing the flowchart of a manufacturing method of array substrate provided by an embodiment of the present invention.
Figure 6A:
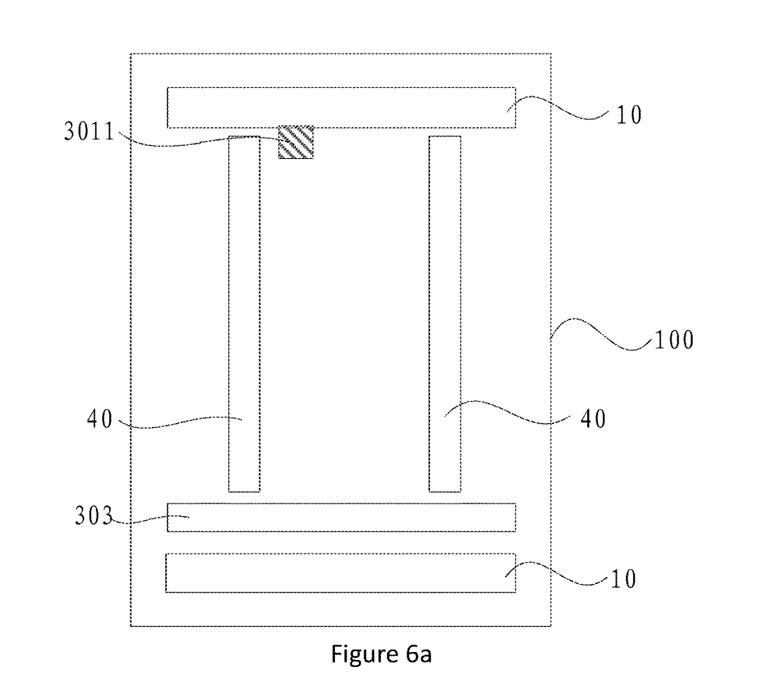
FIGS. 6a-6g are schematic views of the array substrate during manufacturing process provided by an embodiment of the present invention.

Refer to FIG. 5 and FIGS. 6a-6g. The manufacturing method of array substrate of the present invention comprises:

S101: forming a plurality of scan lines 10, a plurality of first auxiliary segments 40 and gates 3011 of a plurality of thin film transistors (TFT) 301, wherein the gate 3011 of each TFT 301 being connected to a corresponding scan line 10;

Optionally, forming a first common electrode 303 at the same layer as the plurality of scan lines 10 and the first auxiliary segments 40.

Figure 6B:
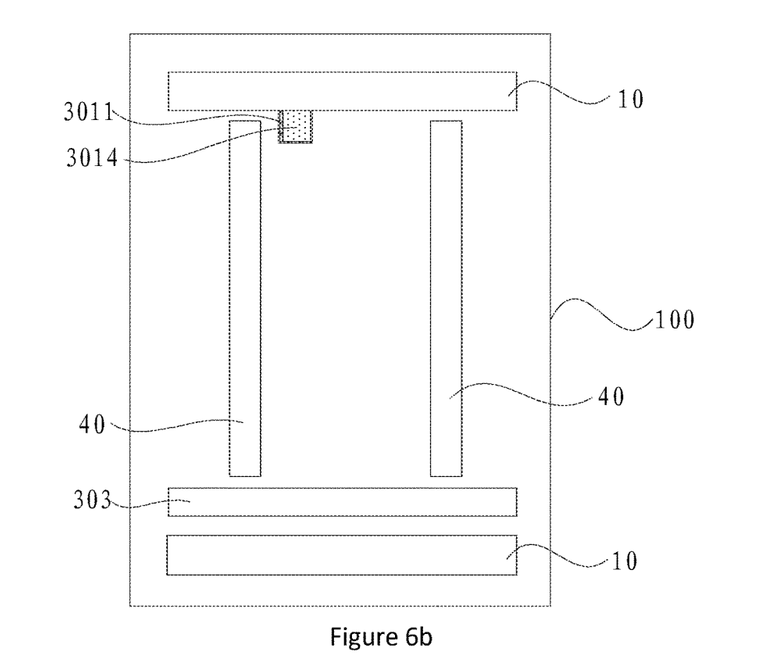
Figure 6C:
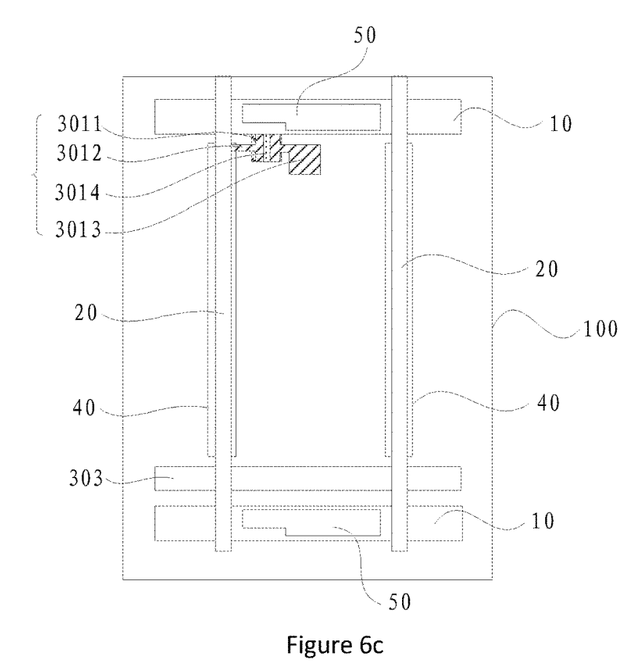

S102: forming a semiconductor layer 3014 of the plurality of TFTs 301;

S103: forming a plurality of data lines 20, a plurality of second auxiliary segments 50, and sources 3012 and drains 3013 of a plurality of TFTs 301, wherein the source 3012 of each TFT 301 being connected to a corresponding data line 20;

Optionally, a part of each scan line 10 corresponding to inside of a pixel area corresponds to a second auxiliary segment 50, and the length of the second auxiliary segment 50 is less than the part of each scan line 10 corresponding to inside of a pixel area so that the second auxiliary segment 50 does not overlap the overlapping part of the scan line 10 and data line 20;

A part of each data line 20 corresponding to inside of a pixel area corresponds to a first auxiliary segment 40, and the length of the first auxiliary segment 40 is less than the part of each data line 20 corresponding to inside of a pixel area so that the first auxiliary segment 40 does not overlap the overlapping part of the scan line 10 and data line 20.

Wherein, each of the plurality of scan lines 10 and/or each of the plurality of data lines 20 corresponding respectively to at least an auxiliary segment, the scan lines 10 and/or data lines 20 forming capacitive coupling with corresponding auxiliary segments to reduce signal delay on the scan lines 10 and/or data lines 20.

Figure 6D:
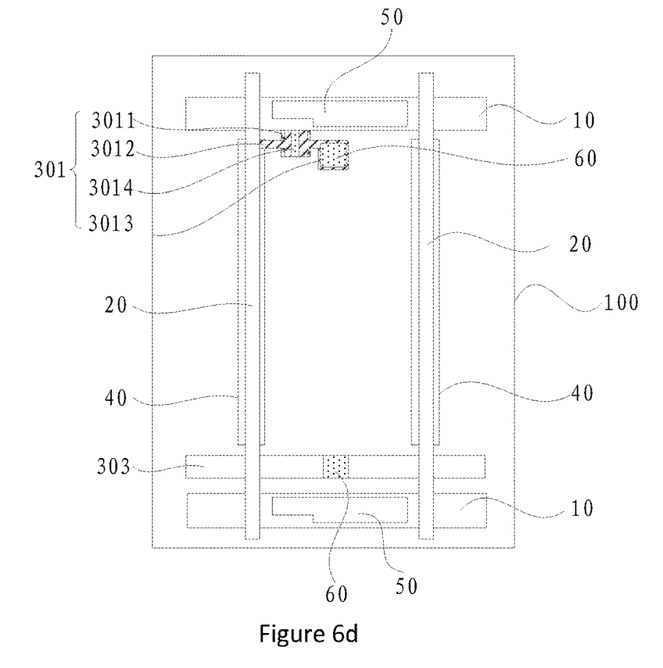

S104: forming a color filter layer 60;

Optionally, the color filter layer 60 can be disposed on a color film substrate disposed opposite to the array substrate in the liquid crystal display device.

Figure 6E:
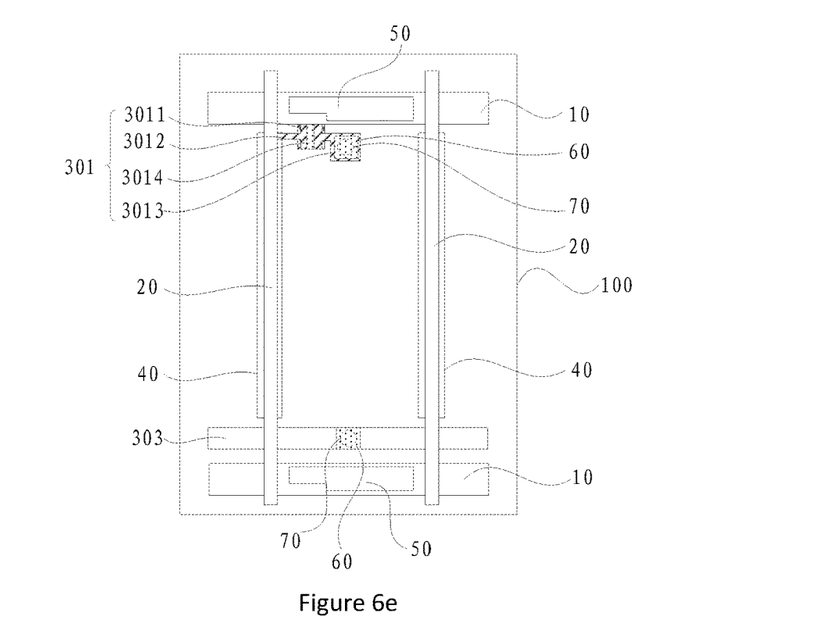

S105: disposing a plurality of vias 70 on the color filter layer 60 so as to make each pixel electrode 302 electrically connected to the drain 3013 of a corresponding TFT 301 when forming a plurality of pixel electrodes 302.

Figure 6F:
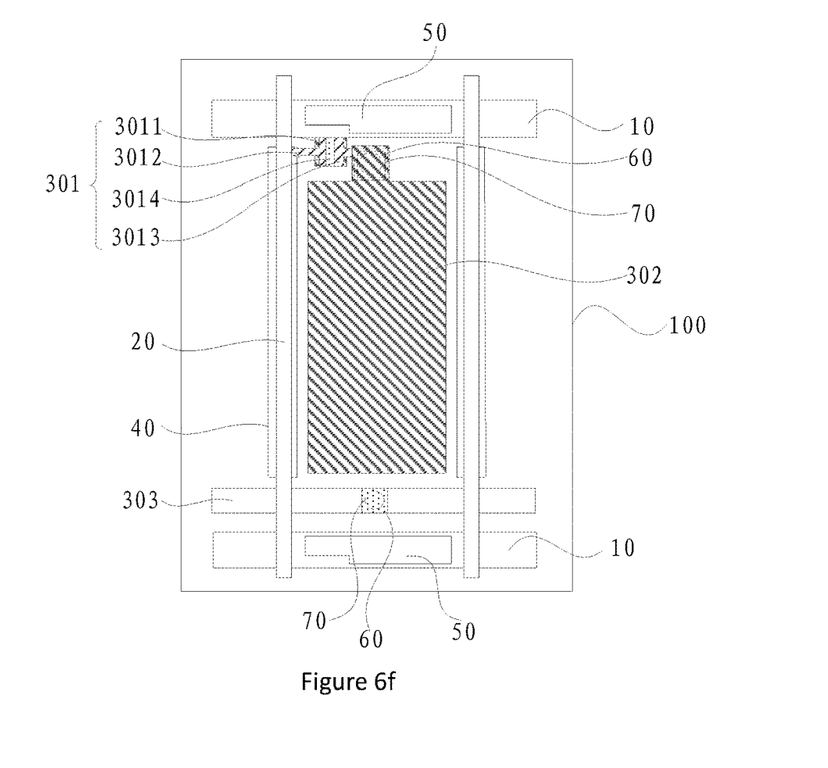
Figure 6G:
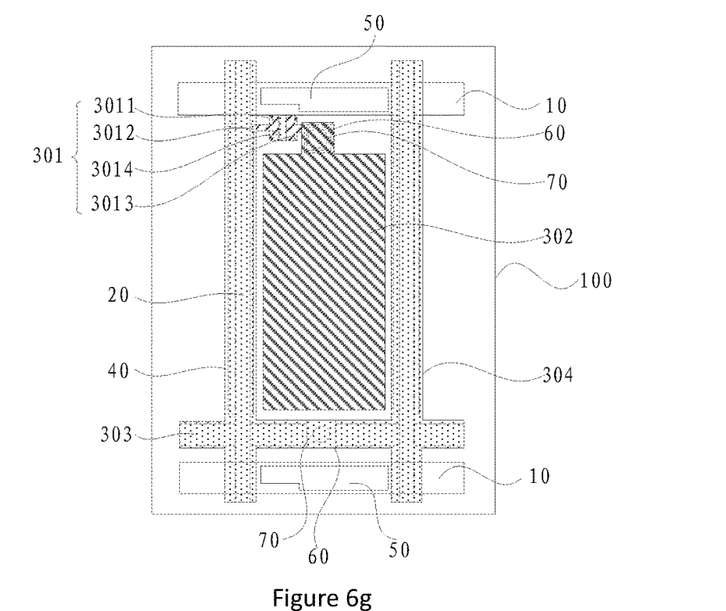

S106: forming a plurality of pixel electrodes 302, wherein each pixel electrodes 302 being connected to the drain 3013 of a corresponding TFT 301;

Optionally, a second common electrode 304 is formed at the same layer as the pixel electrode 302.

Figure 7:
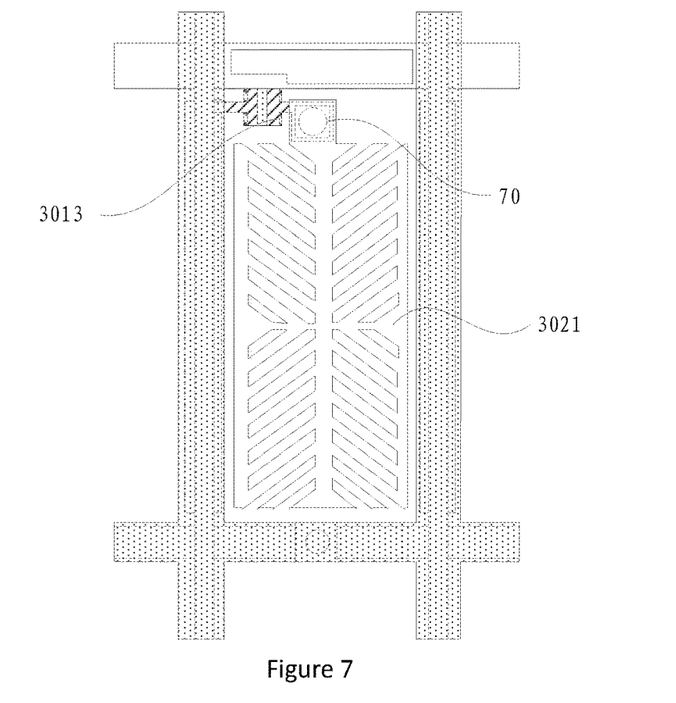
FIG. 7 is a schematic view showing the structure of a pixel of VA mode by the manufacturing method of array substrate provided by an embodiment of the present invention.
Figure 8:
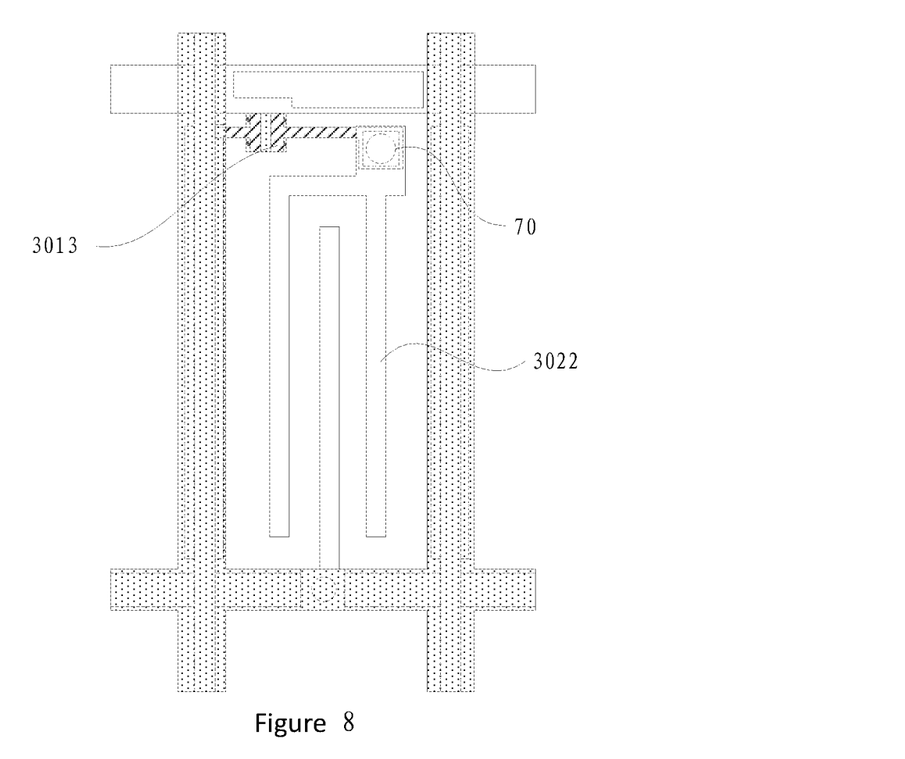
FIG. 8 is a schematic view showing the structure of a pixel of IPS mode by the manufacturing method of array substrate provided by an embodiment of the present invention.

Optionally, the array substrate can be of vertical alignment (VA) mode, with the pixel structure shown in FIG. 7. The pixel electrode 3021 is connected to the drain 3013 of TFT 301 through the via 70; the array substrate can be of In-plane switching (IPS) mode, with the pixel structure shown in FIG. 8. The pixel electrode 3022 is connected to the drain 3013 of TFT 301 through the via 70.

Optionally, the array substrate can be of twist nematic (TN) mode, multi-domain vertical alignment (MVA) mode or fringe field switching (FFS) mode.

By disposing at least an auxiliary segment corresponding to each scan line and/or each data line on the array substrate, the present invention can reduce the signal delay on the scan line and/or data line, improve charging rate and display effect.

Figure 9:
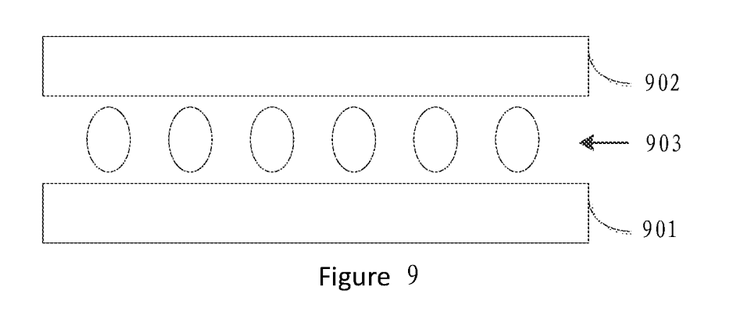
FIG. 9 is a schematic view showing the showing the structure of a display device provided by an embodiment of the present invention.

Refer to FIG. 9. The LCD display device of the present invention comprises an array substrate 901 as described above, an opposite substrate 902 and a liquid crystal layer disposed between the array substrate 901 and the opposite substrate 902.

The arrays substrate has a structure as described above, and the details will not be repeated here.

By disposing at least an auxiliary segment corresponding to each scan line and/or each data line on the array substrate, the present invention can reduce the signal delay on the scan line and/or data line, improve charging rate and display effect.

It should be noted that in the present disclosure the terms, such as, first, second are only for distinguishing an entity or operation from another entity or operation, and does not imply any specific relation or order between the entities or operations. Also, the terms "comprises", "include", and other similar variations, do not exclude the inclusion of other non-listed elements. Without further restrictions, the expression "comprises a . . . " does not exclude other identical elements from presence besides the listed elements.

Embodiments of the present invention have been described, but not intending to impose any unduly constraint to the appended claims. Any modification of equivalent structure or equivalent process made according to the disclosure and drawings of the present invention, or any application thereof, directly or indirectly, to other related fields of technique, is considered encompassed in the scope of protection defined by the claims of the present invention.

What is claimed is:

1. A liquid crystal display (LCD) device, comprising an array substrate, wherein the array substrate comprising:
   a plurality of scan lines;
   a plurality of data lines, intersecting with the plurality of scan lines so as to define a plurality of pixel areas;
   a plurality of auxiliary segments, each of the plurality of scan lines and/or each of the plurality of data lines corresponding respectively to at least an auxiliary segment, the scan lines and/or data lines forming capacitive coupling with corresponding auxiliary segments to reduce signal delay on the scan lines and/or data lines;
   the auxiliary segment comprising a first auxiliary segment and a second auxiliary segment, the first auxiliary segment being parallel to the data line, and disposed at the same layer as the scan line; and the second segment being parallel to the scan line, and disposed at the same layer as the data line;
   the auxiliary segment being in a floating mode so as to form capacitive coupling with the scan line or the data line;
   wherein a part of each scan line corresponding to inside of a pixel area corresponds to a second auxiliary segment, and the length of the second auxiliary segment is less than the part of each scan line corresponding to inside of a pixel area so that the second auxiliary segment does not overlap the overlapping part of the scan line and the data line;
   a part of each data line corresponding to inside of a pixel area corresponds to a first auxiliary segment, and the length of the first auxiliary segment is less than the part of each data line corresponding to inside of a pixel area so that the first auxiliary segment does not overlap the overlapping part of the scan line and data line.

2. The LCD display device as claimed in claim 1, wherein each pixel area comprises a thin film transistor (TFT) and a pixel electrode, wherein the TFT has a gate electrically connected to a corresponding scan line, a source electrically connected to a corresponding data line, and a drain electrically connected to the pixel electrode.

3. The LCD display device as claimed in claim 2, wherein the gate of the TFT is disposed at the same layer as the first auxiliary segment, and the source and the drain of the TFT are disposed at the same layer as the second auxiliary segment.

4. The LCD display device as claimed in claim 1, wherein the array substrate can be of vertical alignment (VA) mode, in-plane switching (IPS) mode, twist nematic (TN) mode, multi-domain vertical alignment 9MVA) mode, or fringe field switching (FFS) mode.

5. An array substrate, comprising:
   a plurality of scan lines;
   a plurality of data lines, intersecting with the plurality of scan lines so as to define a plurality of pixel areas;
   a plurality of auxiliary segments, wherein each of the plurality of scan lines and/or each of the plurality of data lines corresponding respectively to at least an auxiliary segment, the scan lines and/or data lines forming capacitive coupling with corresponding auxiliary segments to reduce signal delay on the scan lines and/or data lines;
   wherein the auxiliary segment comprises a first auxiliary segment and a second auxiliary segment, wherein the first auxiliary segment is parallel to the data line, and disposed at the same layer as the scan line; and the second segment is parallel to the scan line, and disposed at the same layer as the data line;
   wherein a part of each scan line corresponding to inside of a pixel area corresponds to a second auxiliary segment, and the length of the second auxiliary segment is less than the part of each scan line corresponding to inside of a pixel area so that the second auxiliary segment does not overlap the overlapping part of the scan line and the data line;
   a part of each data line corresponding to inside of a pixel area corresponds to a first auxiliary segment, and the length of the first auxiliary segment is less than the part of each data line corresponding to inside of a pixel area so that the first auxiliary segment does not overlap the overlapping part of the scan line and data line.

6. The array substrate as claimed in claim 5, wherein each pixel area comprises a thin film transistor (TFT) and a pixel electrode, wherein the TFT has a gate electrically connected to a corresponding scan line, a source electrically connected to a corresponding data line, and a drain electrically connected to the pixel electrode.

7. The array substrate as claimed in claim 6, wherein the gate of the TFT is disposed at the same layer as the first auxiliary segment, and the source and the drain of the TFT are disposed at the same layer as the second auxiliary segment.

8. The array substrate as claimed in claim 5, wherein each of the plurality of scan lines and/or each of the plurality of data lines corresponds respectively to at least an auxiliary segment, the scan lines and/or data lines form capacitive coupling with corresponding auxiliary segments to reduce signal delay on the scan lines and/or data lines.

9. A manufacturing method of array substrate, comprising:
   forming a plurality of scan lines, a plurality of first auxiliary segments and gates of a plurality of thin film transistors (TFT), wherein the gate of each TFT being connected to a corresponding scan line;
   forming a semiconductor layer of the plurality of TFTs;
   forming a plurality of data lines, a plurality of second auxiliary segments, and sources and drains of a plurality of TFTs, wherein the source of each TFT being connected to a corresponding data line;

forming a plurality of pixel electrodes, wherein each pixel electrodes being connected to the drain of a corresponding TFT;

each scan line and/or each data line respectively corresponding to at least an auxiliary segment, the scan line and/or data line and the corresponding auxiliary segment forming capacitive coupling to reduce signal delay on the scan line and/or data line;

wherein after the step of forming a plurality of data lines, a plurality of second auxiliary segments, and sources and drains of a plurality of TFTs, further comprises:

forming a color filter layer, and disposing a plurality of vias on the color filter layer so as to make each pixel electrode electrically connected to the drain of a corresponding TFT when forming a plurality of pixel electrodes.

10. The manufacturing method of array substrate as claimed in claim 9, wherein a part of each scan line corresponding to inside of a pixel area corresponds to a second auxiliary segment, and the length of the second auxiliary segment is less than the part of each scan line corresponding to inside of a pixel area so that the second auxiliary segment does not overlap the overlapping part of the scan line and the data line;

a part of each data line corresponding to inside of a pixel area corresponds to a first auxiliary segment, and the length of the first auxiliary segment is less than the part of each data line corresponding to inside of a pixel area so that the first auxiliary segment does not overlap the overlapping part of the scan line and data line.

* * * * *